(12) United States Patent
Matsumoto

(10) Patent No.: US 11,099,014 B2
(45) Date of Patent: Aug. 24, 2021

(54) CHIP MODULE, SIGNAL PROCESSING METHOD, AND ELECTRONIC EQUIPMENT

(71) Applicant: SONY SEMICONDUCTOR SOLUTIONS CORPORATION, Kanagawa (JP)

(72) Inventor: Tomohiro Matsumoto, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 179 days.

(21) Appl. No.: 16/328,975

(22) PCT Filed: Oct. 4, 2017

(86) PCT No.: PCT/JP2017/036089
§ 371 (c)(1),
(2) Date: Feb. 27, 2019

(87) PCT Pub. No.: WO2018/074230
PCT Pub. Date: Apr. 26, 2018

(65) Prior Publication Data
US 2019/0234738 A1    Aug. 1, 2019

(30) Foreign Application Priority Data
Oct. 18, 2016 (JP) .............................. JP2016-204476

(51) Int. Cl.
*G01C 19/5776* (2012.01)
*G01D 3/028* (2006.01)
(Continued)

(52) U.S. Cl.
CPC ..... *G01C 19/5776* (2013.01); *G01C 19/5712* (2013.01); *G01C 19/5726* (2013.01);
(Continued)

(58) Field of Classification Search
CPC .............. G01C 19/5776; G01C 25/005; G01C 19/5712; G01C 19/5726; G01D 3/028; H01L 29/84
See application file for complete search history.

(56) References Cited

U.S. PATENT DOCUMENTS 7,801,694 B1 * 9/2010 Watson ................. G01C 19/56
702/104
2002/0118051 A1    8/2002 Suzuki et al.
(Continued)

FOREIGN PATENT DOCUMENTS

EP    1193856 A2    4/2002
EP    2503302 A2 *  9/2012 ............. G01C 21/16
(Continued)

OTHER PUBLICATIONS

International Search Report and Written Opinion of PCT Application No. PCT/JP2017/036089, dated Dec. 12, 2017, 09 pages of ISRWO.
(Continued)

*Primary Examiner* — Ryan D Walsh
(74) *Attorney, Agent, or Firm* — Chip Law Group

(57) ABSTRACT

The present technology relates to a chip module, a signal processing method, and electronic equipment that are aimed at enabling a change before and after mounting a module to be debugged and enabling a mounting module to be easily designed. A gyro module includes a MEMS that is formed into a chip and an IC that processes a detection signal from the MEMS, which are arranged above and below. The IC has a temperature sensor and stress sensor that detect an external environment within the IC in plurality and outputs difference values obtained by subtracting reference sensor values that are sensor values of the temperature sensors and the stress sensors at the time of calibration from sensor values detected by a plurality of the temperature sensors and the stress
(Continued)

sensors respectively. The present technology can be applied, for example, to the gyro module or the like.

11 Claims, 10 Drawing Sheets

(51) Int. Cl.
    *G01C 19/5712*     (2012.01)
    *G01C 19/5726*     (2012.01)
    *H01L 29/84*     (2006.01)
    *G01C 25/00*     (2006.01)

(52) U.S. Cl.
    CPC ........... *G01C 25/005* (2013.01); *G01D 3/028* (2013.01); *H01L 29/84* (2013.01)

(56) References Cited

U.S. PATENT DOCUMENTS

| | | | | |
|---|---|---|---|---|
| 2009/0007661 | A1* | 1/2009 | Nasiri | G01C 19/5769 73/504.03 |
| 2011/0113891 | A1 | 5/2011 | Hayner et al. | |
| 2014/0007645 | A1 | 1/2014 | Uemura et al. | |
| 2015/0114082 | A1* | 4/2015 | Blanchard | G01C 25/005 73/1.77 |
| 2017/0122976 | A1* | 5/2017 | Mitchell | G01P 21/00 |
| 2018/0017385 | A1* | 1/2018 | Shirvani | G01C 19/56 |
| 2018/0231393 | A1* | 8/2018 | Czaja | G01L 25/00 |

FOREIGN PATENT DOCUMENTS

| | | | | |
|---|---|---|---|---|
| EP | 3203190 | A1 * | 8/2017 | ............. G01P 1/006 |
| JP | 60-154677 | A | 8/1985 | |
| JP | 2002-111388 | A | 4/2002 | |
| JP | 2005-257504 | A | 9/2005 | |
| JP | 2005-257623 | A | 9/2005 | |
| WO | 2012/147348 | A1 | 11/2012 | |
| WO | WO-2013143126 | A1 * | 10/2013 | ........... G01C 25/005 |
| WO | WO-2016168974 | A1 * | 10/2016 | ............ G05D 1/0011 |

OTHER PUBLICATIONS

Prandi, et al., "A Low-Power 3-Axis Digital-Output MEMS Gyroscope with Single Drive and Multiplexed Angular Rate Readout", 2011 IEEE International Solid-State Circuits Conference, Feb. 21, 2011, 104-106 pages.

Prandi, et al., "A Low-Power 3-Axis Digital-Output MEMS Gyroscope with Single Drive and Multiplexed Angular Rate Readout", 2011 IEEE International Solid-State Circuits Conference, Session 6, Sensors and Energy Harvesting, Feb. 21, 2011, pp. 104-105.

* cited by examiner

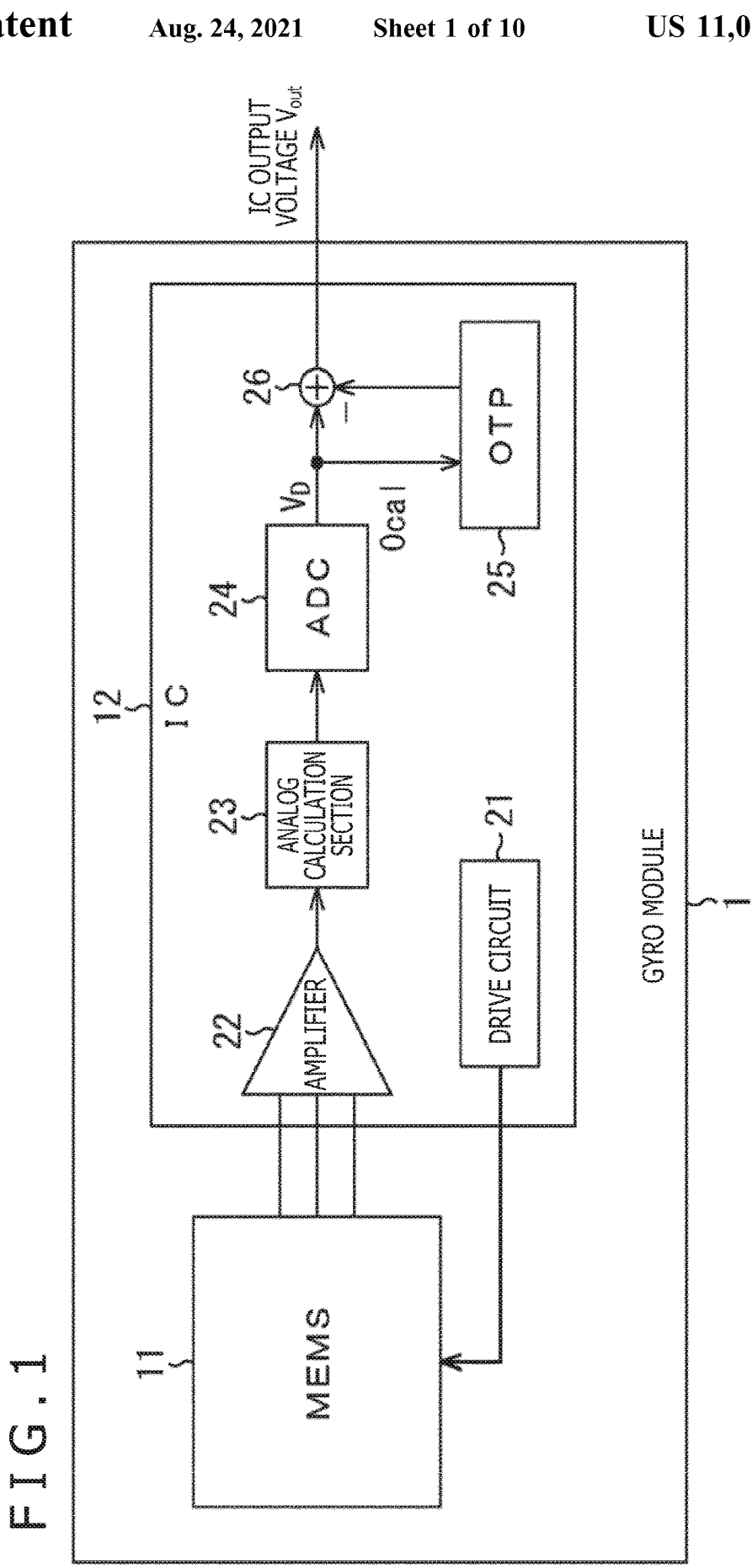

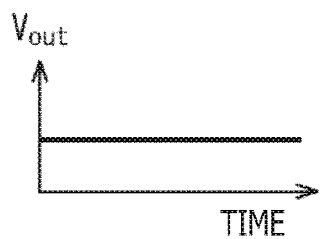
FIG. 2A  AT GYRO MODULE MANUFACTURING TIME
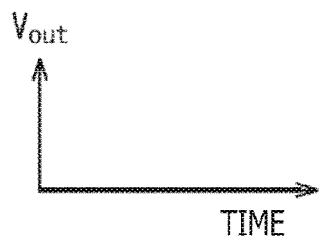
FIG. 2B  AFTER OFFSET ADJUSTMENT
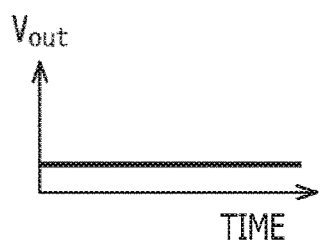
FIG. 2C  AFTER CAMERA MODULE MOUNTING FIG. 9
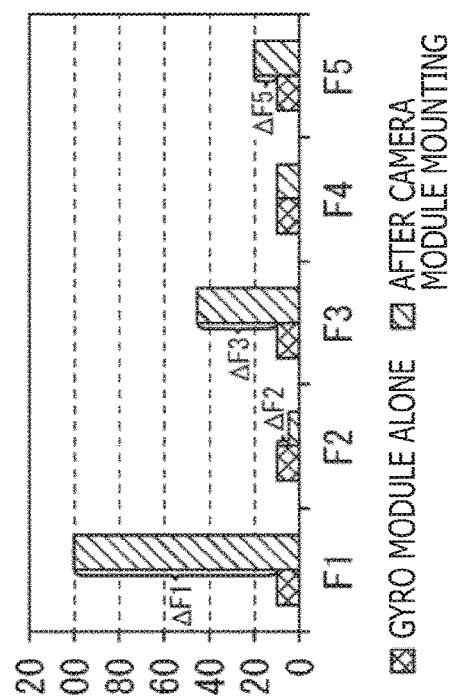
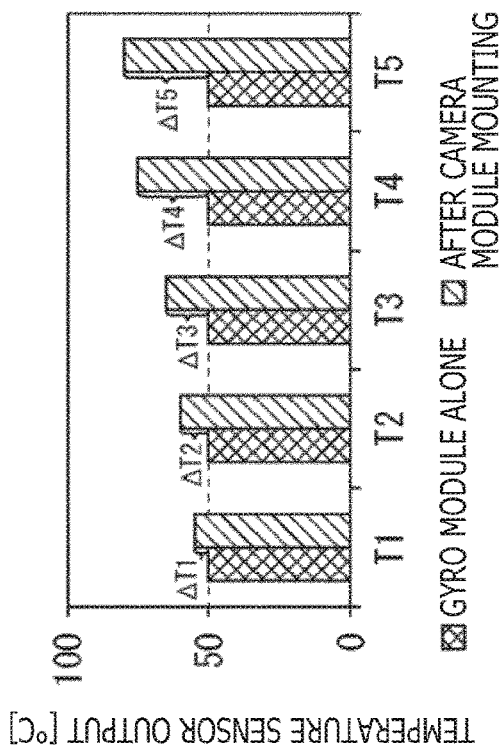

CHIP MODULE, SIGNAL PROCESSING METHOD, AND ELECTRONIC EQUIPMENT

CROSS REFERENCE TO RELATED APPLICATIONS

This application is a U.S. National Phase of International Patent Application No. PCT/JP2017/036089 filed on Oct. 4, 2017, which claims priority benefit of Japanese Patent Application No. JP 2016-204476 filed in the Japan Patent Office on Oct. 18, 2016. Each of the above-referenced applications is hereby incorporated herein by reference in its entirety.

TECHNICAL FIELD

The present technology relates to a chip module, a signal processing method, and electronic equipment. Particularly, the present technology relates to a chip module, a signal processing method, and electronic equipment that are aimed at enabling a change before and after mounting a module to be debugged and enabling a mounting module to be easily designed.

BACKGROUND ART

A Gyroscope module (hereinafter, referred to as a gyro module) is mostly used, for example, for a hand-shake correction of a camera or the like.

An influence of an external environment such as a stress or heat is received and values of the gyro module are changed. Therefore, an adjustment is performed so that an output is equal to zero when the gyro module is manufactured. Further, after the gyro module is mounted on a camera module or the like, an output may be offset again. In the above phenomenon, for example, a change due to a temperature is corrected and therefore a single temperature sensor is built-in the gyro module (for example, PTL 1, NPL 1, and the like).

CITATION LIST

Patent Literature

[PTL 1]
JP 2005-257504A

Non Patent Literature

[NPL 1]
Luciano Prandi, "A Low-Power 3-Axis Digital-Output MEMS Gyroscope with Single Drive and Multiplexed Angular Rate Readout," 2011 IEEE International Solid-State Circuits Conference, 2011, p. 104-106

SUMMARY

Technical Problem

However, it is impossible to measure an accurate temperature of all portions except a portion close to a temperature sensor by using a single temperature sensor. Further, when a gradient in the temperature occurs within a gyro module, it is impossible to detect information regarding the gradient.

The present technology has been made in view of such circumstances and is aimed at enabling a change before and after mounting a module to be debugged and enabling a mounting module to be easily designed.

Solution to Problem

A chip module according to a first aspect of the present technology includes: a sensor that is formed into a chip; and a signal processing IC that processes a detection signal from the sensor, the sensor and the signal processing IC being arranged above and below. The signal processing IC has an external environment sensor that detects an external environment within an IC in plurality and outputs a difference value obtained by subtracting a reference sensor value that is a sensor value of the external environment sensor at a time of calibration from a sensor value detected by a plurality of the external environment sensors respectively.

A signal processing method of a chip module according to a second aspect of the present technology includes: having, in a chip module including a sensor that is formed into a chip and a signal processing IC that processes a detection signal from the sensor, the sensor and the signal processing IC being arranged above and below, an external environment sensor that detects an external environment within an IC in plurality by the signal processing IC; and outputting a difference value obtained by subtracting a reference sensor value that is a sensor value of the external environment sensor at a time of calibration from a sensor value detected by a plurality of the external environment sensors respectively.

Electronic equipment according to a third aspect of the present technology includes: a chip module including a sensor that is formed into a chip, and a signal processing IC that processes a detection signal from the sensor, the sensor and the signal processing IC being arranged above and below. The signal processing IC has an external environment sensor that detects an external environment within an IC in plurality and outputs a difference value obtained by subtracting a reference sensor value that is a sensor value of the external environment sensor at a time of calibration from a sensor value detected by a plurality of the external environment sensors respectively.

According to the first to third aspects of the present technology, a sensor that is formed into a chip and a signal processing IC that processes a detection signal from the sensor are arranged above and below. In the signal processing IC, an external environment sensor that detects an external environment is provided in plurality within an IC. Further, there is output a difference value obtained by subtracting a reference sensor value that is a sensor value of the external environment sensor at the time of calibration from a sensor value detected by a plurality of the external environment sensors respectively.

A chip module may be an independent apparatus or an internal block that configures a single apparatus.

Advantageous Effect of Invention

According to first to third aspects of the present technology, a change before and after mounting a module is enabled to be debugged and a mounting module is enabled to be easily designed.

Note that, the effect described here is not necessarily limited, and may be any of the effects described within the present disclosure.

BRIEF DESCRIPTION OF DRAWINGS

FIG. 1 is a diagram describing a problem when mounting a gyro module on a camera module.

FIGS. 2A, 2B, and 2C are diagrams describing a problem when mounting the gyro module on the camera module.

FIG. 9 is a diagram illustrating a sensor output example.

DESCRIPTION OF EMBODIMENT

Figure 3:
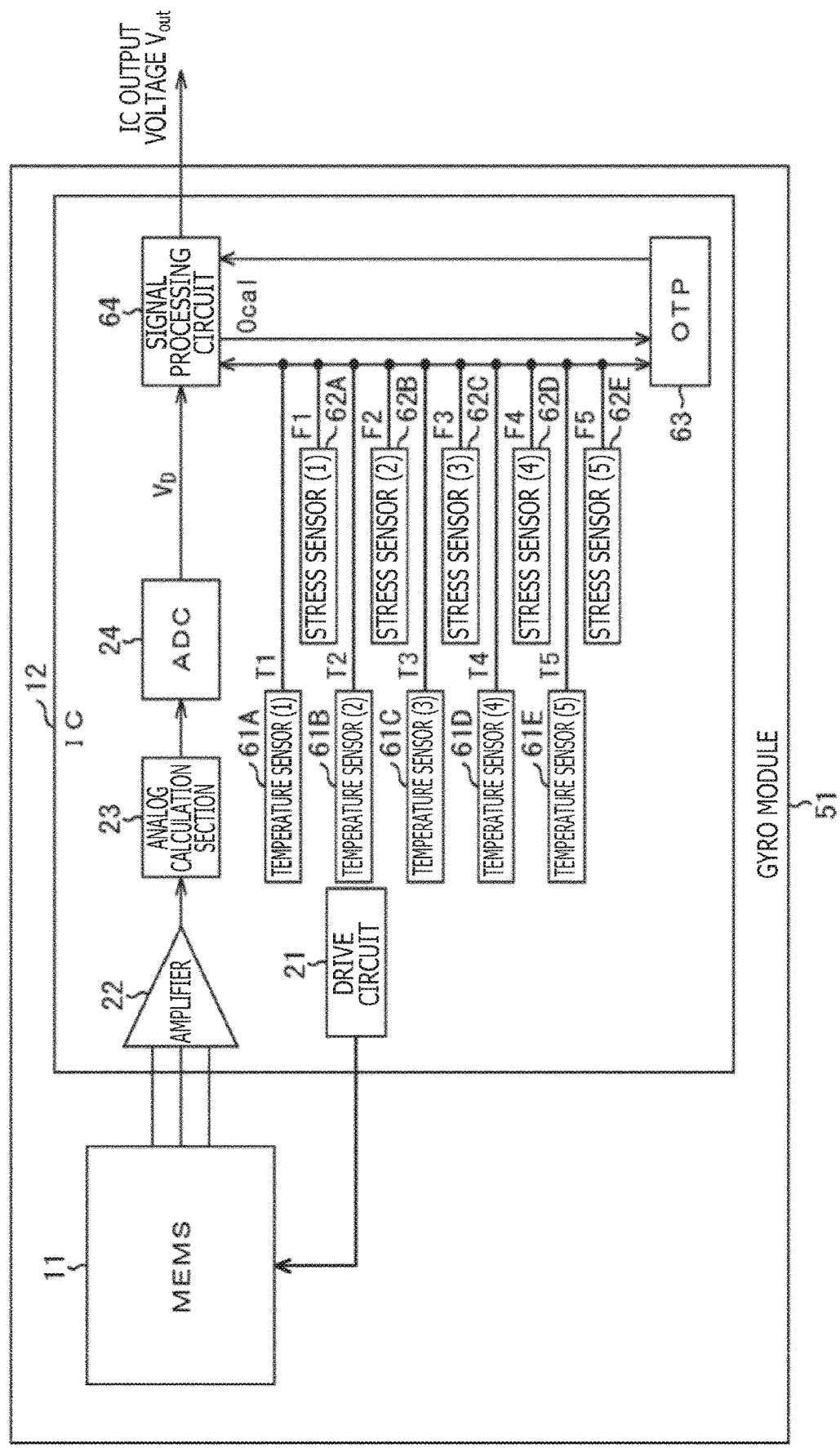
FIG. 3 is a block diagram illustrating a configuration example of the gyro module to which the present technology is applied.

Hereinafter, a mode (hereinafter, referred to as an embodiment) for carrying out the present technology will be described. Note that descriptions will be made in the following order.

1. Problems at the time of Mounting Camera Module
2. Embodiment of Gyro Module to Which the Present Technology is Applied 1. Problems at the Time of Mounting Camera Module First, problems at the time when a gyro module is mounted on a camera module will be described with reference to FIGS. 1, 2A, and 2B.

FIG. 1 is a block diagram illustrating a fundamental configuration of a gyro module.

A gyro module 1 is integrally manufactured through a package by a MEMS (Micro Electro Mechanical Systems) 11 that controls mechanical operations and an IC (signal processing IC) 12 that drives the MEMS 11 and processes an angular velocity detection signal or the like output from the MEMS 11.

The IC 12 includes a drive circuit 21, an amplifier 22, an analog calculation section 23, an ADC (Analog/Digital Converter) 24, an OTP (One Time Programmable read only memory) 25, and an adder 26.

The MEMS 11 drives devices on the basis of a driving signal supplied from the drive circuit 21 of the IC 12. For example, the MEMS grasps a displacement generated by a Coriolis force (acceleration) as a change in capacitance and thereby outputs the detection signal including angular velocity information of three axes of a yawing axis, a pitch axis, and a roll axis.

The amplifier 22 amplifies the detection signal including the angular velocity information of three axes output from the MEMS 11 and outputs voltage to the analog calculation section 23. The analog calculation section 23 takes out only the angular velocity information from the detection signal output by the amplifier 22 and outputs the angular information to the ADC 24. The ADC 24 converts an analog voltage signal as the angular velocity information into a digital voltage value $V_D$ and outputs the digital voltage value $V_D$ to the outside via the adder 26. Note that in the case where the IC 12 performs an analog output, an output from the analog calculation section 23 is supplied directly to the adder 26 and at the same time an output from the OTP 25 is converted into an analog signal by a DAC (Digital/Analog Converter) and then supplied to the adder 26.

An IC output voltage $V_{out}$ representing the angular velocity, which is output from the IC 12 as an output from the gyro module 1, is ideally equal to zero in a non-rotation state in which the gyro module 1 itself is not rotated.

However, even in the non-rotation state, the IC output voltage $V_{out}$ is not equal to zero as illustrated in FIG. 2A and an offset occurs in the IC output voltage $V_{out}$ due to a stress, heat, etc. of the package. A value of the offset is different in each individual piece of the manufactured gyro module. In an application of an actual hand-shake correction or the like, phase information obtained by integrating an output from the gyro module is used. Therefore, when a fixed value is output even in the non-rotation state, a large phase error is allowed to occur.

To adjust the offset to zero, the OTP 25 that is a memory in which a code can be written only once is provided on the IC 12.

In calibration processing for adjusting the offset, the IC output voltage $V_{out}$ (voltage value $V_D$ from the ADC 24 before an offset adjustment) in the non-rotation state of the gyro module 1 is stored in the OTP 25 as an offset adjustment value Ocal.

After the offset adjustment, in the adder 26, the offset adjustment value Ocal stored in the OTP 25 is subtracted from the voltage value $V_D$ output from the ADC 24 and a subtraction result is output from the IC 12 as the IC output voltage $V_{out}$.

As illustrated in FIG. 2B, through the process, the IC output voltage $V_{out}$ in the non-rotation state of the gyro module 1 is output at zero. The calibration processing is performed, for example, before shipping the completed gyro module 1.

However, in a shipping destination, for example, when the gyro module 1 is mounted on the camera module, in some cases, an influence of a stress, heat, etc. in a mounting environment is received and the offset occurs in the IC output voltage $V_{out}$ again as illustrated in FIG. 2C. The reason is that an environment at an offset adjustment time of the gyro module 1 differs from that (stress, heat, etc.) at a camera module mounting time.

The camera module (mounting module) is required to be designed for a structure in which the offset does not occur in the IC output voltage $V_{out}$ of the mounted gyro module. However, conditions of a stress, heat, etc. before and after mounting the gyro module are obscure, and therefore it is difficult to design an appropriate structure in which the offset is prevented from occurring. In the result, the number of man-hours of adjustment or debug for preventing the offset from occurring in the mounting module increases.

2. Embodiment of Gyro Module to which the Present Technology is Applied

To solve the above problem, hereinafter, the gyro module that is aimed at making it easy to debug a change before and after mounting the gyro module on the camera module and further making it easy to design an appropriate structure of the camera module and that deletes an adjustment man-hour after the mounting will be described.

<Block Diagram>

FIG. 3 is a block diagram illustrating a configuration example of a gyro module to which the present technology is applied.

In FIG. 3, parts common to those in FIG. 1 have the same symbol. Therefore, a description thereof will be appropriately omitted.

When the gyro module 51 illustrated in FIG. 3 is compared with the gyro module 1 illustrated in FIG. 1, a temperature sensor 61 and a stress sensor 62 respectively are provided in plurality inside the IC 12 in the gyro module 51. In the present embodiment, it is assumed that five temperature sensors 61A to 61E and five stress sensors 62A to 62E are provided inside the IC 12.

Further, on the gyro module 51, an OTP 63 is provided in place of the OTP 25 illustrated in FIG. 1 and a signal processing circuit 64 is provided in place of the adder 26. The other configuration of the gyro module 51 is similar to that of the gyro module 1.

Five temperature sensors 61A to 61E detect temperatures around the sensors and output sensor values T1 to T5 that are results thereof to the OTP 63 or the signal processing circuit 64.

Five stress sensors 62A to 62E detect stresses around the sensors and output sensor values F1 to F5 that are results thereof to the OTP 63 or the signal processing circuit 64.

Note that, in FIG. 3, to simplify the figure, signal lines of the sensor values T1 to T5 and F1 to F5 are mixed into a single signal line to be described. However, respective detection results are individually supplied to the OTP 63 or the signal processing circuit 64.

The OTP 63 is the same kind of a memory as that of the OTP 25 illustrated in FIG. 1; however, data stored in the OTP 63 is different from that stored in the OTP 25. In the OTP 63, detection results of five temperature sensors 61A to 61E and five stress sensors 62A to 62E can be written only once, respectively, for storage in addition to the offset adjustment value Ocal similarly to that of the OTP 25 illustrated in FIG. 1.

The signal processing circuit 64 performs the calibration processing for adjusting the IC output voltage $V_{out}$ so that the IC output voltage $V_{out}$ is output at zero in the non-rotation state of the gyro module 51. In the calibration processing, not only the offset adjustment value Ocal but also the sensor values T1 to T5 and F1 to F5 detected by five temperature sensors 61A to 61E and five stress sensors 62A to 62E respectively are stored in the OTP 63 at that time.

Figure 4:
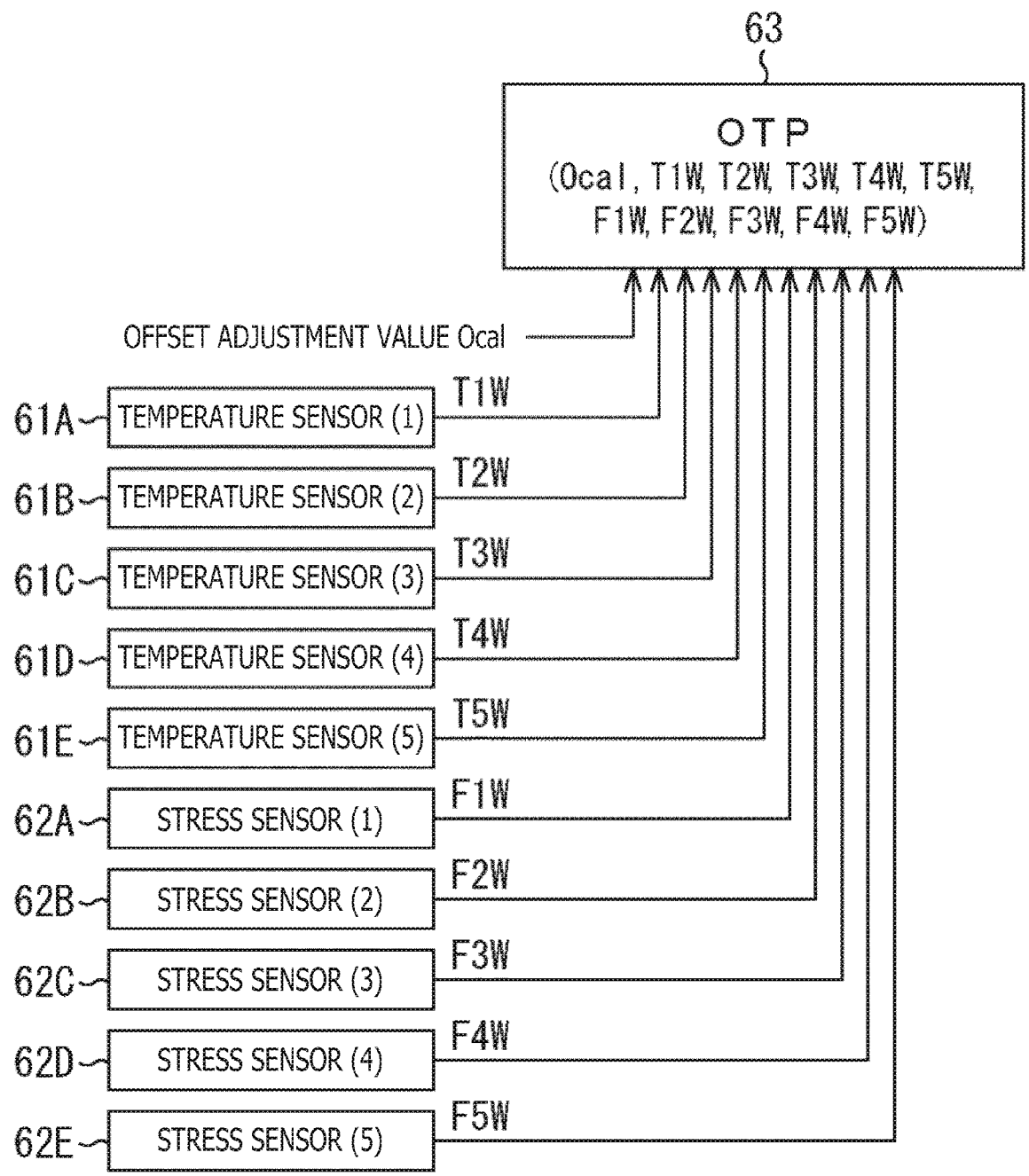
FIG. 4 is a diagram describing calibration processing.

FIG. 4 is a diagram describing the calibration processing.

In the calibration processing, the signal processing circuit 64 stores the voltage value $V_D$ from the ADC 24 at the time of the non-rotation state of the gyro module 51 in the OTP 63 as the offset adjustment value Ocal.

Further, at timing at which the offset adjustment value Ocal is written in the OTP 63, even the sensor values T1W to T5W and F1W to F5W detected by five temperature sensors 61A to 61E and five stress sensors 62A to 62E respectively are stored in the OTP 63. The sensor values T1W to T5W and F1W to F5W stored in the OTP 63 at the time of the calibration processing are referred to as a reference sensor value.

Figure 5:
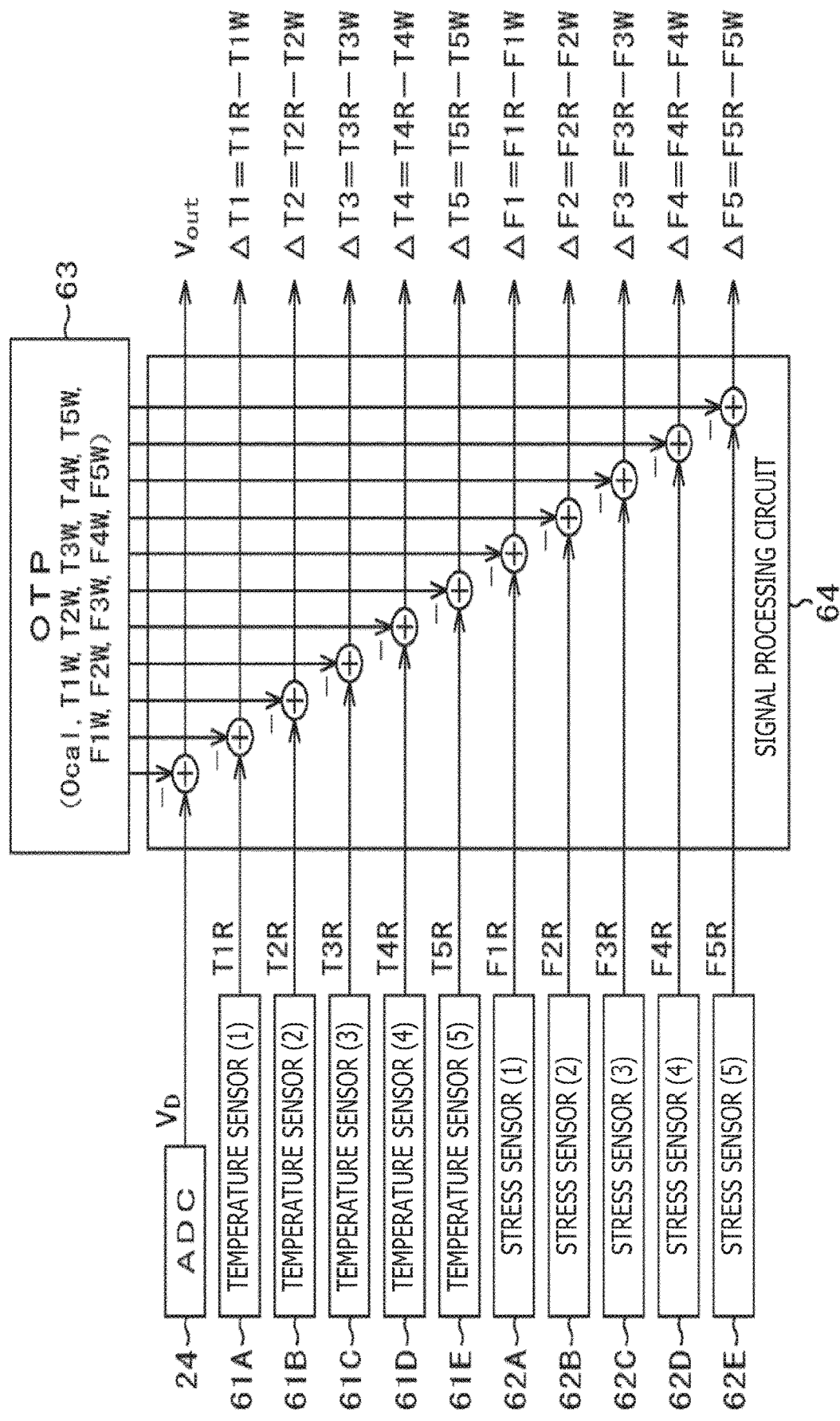
FIG. 5 is a diagram illustrating sensor output processing of a signal processing circuit of the calibration processing or later.

FIG. 5 is a diagram illustrating sensor output processing of the signal processing circuit 64 in the calibration processing or later.

In the calibration processing or later, the signal processing circuit 64 outputs a result ($V_D$−Ocal) in which the offset adjustment value Ocal stored in the OTP 63 is subtracted from the voltage value $V_D$ output from the ADC 24 to the outside as the IC output voltage $V_{out}$.

Further, in the calibration processing or later, the signal processing circuit 64 calculates difference values obtained by subtracting the reference sensor values T1R to T5R and F1R to F5R stored in the OTP 63 from the sensor values T1R to T5R and F1R to F5R detected by five temperature sensors 61A to 61E and five stress sensors 62A to 62E, respectively, namely, ΔT1=(T1R−T1W), ΔT2=(T2R−T2W), ΔT3=(T3R−T3W), ΔT4=(T4R−T4W), ΔT5=(T5R−T5W), ΔF1=(F1R−F1W), ΔF2=(F2R−F2W), ΔF3=(F3R−F3W), ΔF4=(F4R−F4W), and ΔF5=(F5R−F5W) and outputs the difference values to the outside.

<Appearance Diagram>

Figure 6A:
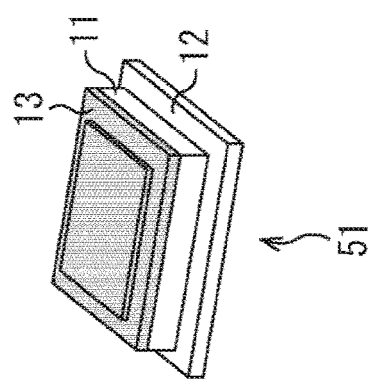
FIGS. 6A, 6B, and 6C are appearance diagrams of the gyro module and an arrangement diagram of a temperature sensor and a stress sensor.

FIG. 6A is a perspective diagram illustrating an appearance of the gyro module 51.

As illustrated in FIG. 6A, the gyro module 51 has a configuration in which the MEMS 11 and IC (IC chip) 12 that are arranged above and below are stuck on each other (bonded together). An upper surface of the MEMS 11 is covered with a ceramic cover 13.

Figure 6B:
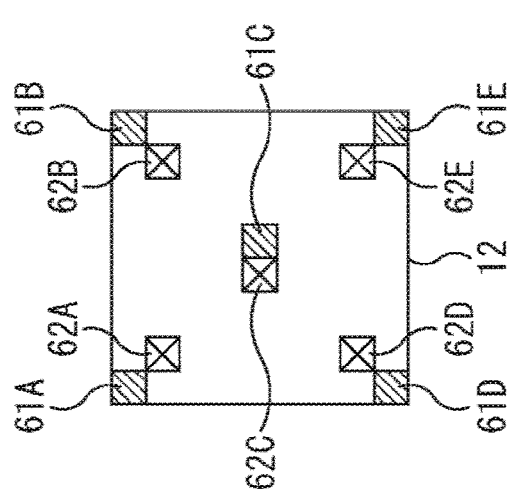

FIG. 6B is a plan diagram indicative of an arrangement of five temperature sensors 61A to 61E and five stress sensors 62A to 62E in an internal area of the IC 12 stuck on the MEMS 11.

Five temperature sensors 61A to 61E and five stress sensors 62A to 62E are evenly arranged in a planar direction as illustrated in FIG. 6B.

Five temperature sensors 61A to 61E and five stress sensors 62A to 62E can be formed within the IC 12 by using a standard process of the IC.

For example, in a Non Patent Literature, "Kamran Souri, 'A CMOS Temperature Sensor With a Voltage-Calibrated Inaccuracy of ±0.15° C. (3σ) From −55° C. to 125° C.,' IEEE Journal of Solid-State Circuits, 2013, Volume 48, Issue 1, p. 292-301," an example in which a temperature sensor is manufactured by using a bipolar transistor is disclosed. Note, however, that to realize a high accuracy, the temperature sensor has a relatively large sensor size of 0.08 $mm^2$. To solve the above problem, as a temperature sensor in which miniaturization is realized, for example, in a Non Patent Literature, "Tejasvi, 'A Self-Referenced VCO-based Temperature Sensor with 0.034° C./mV Supply Sensitivity in 65 nm CMOS,' 2015 Symposium on VLSI Circuits (VLSI Circuits), 2015, p. C200-C201," a temperature sensor using a Voltage Controlled Oscillator (VCO) manufactured by a CMOS transistor is disclosed. The temperature sensor has an extremely small sensor size of 0.004 $mm^2$.

Further, with regard to a stress sensor, a stress sensor using a phenomenon in which a mobility of a transistor is changed due to a stress is disclosed in a Non Patent Literature, "Yigit Mahsereci, 'An Ultra-Thin Flexible CMOS Stress Sensor Demonstrated on an Adaptive Robotic Gripper,' IEEE Journal of Solid-State Circuits, 2016. Volume 51, Issue 1, p. 273-280," or in a Non Patent Literature, "Shujie Yang, 'A CMOS stress sensor chip with integrated signal processing circuits,' SENSORS, 2015 IEEE, 2015, p. 1-4."

Accordingly, the temperature sensor 61 and the stress sensor 62 can be formed within the IC 12 by using the standard process of IC and further can be arranged in plurality in an arbitrary position as illustrated in FIG. 6B.

Figure 6C:
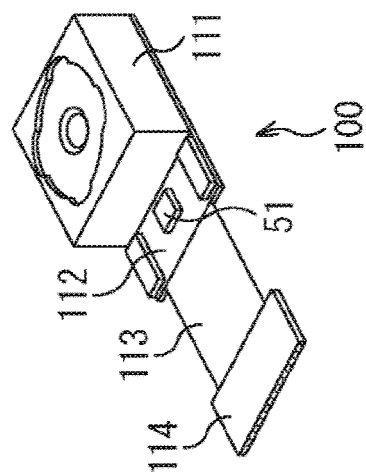

FIG. 6C is a perspective diagram illustrating an appearance of a camera module 100 having the gyro module 51 illustrated in FIG. 6A mounted thereon.

The camera module 100 includes a lens module 111 in which a plurality of condenser lenses, a lens drive apparatus, a solid-state image sensing device, and the like are incorporated and the gyro module 51. The gyro module 51 is arranged on a substrate 112 and electrically connected thereto. An image pickup signal output from the lens module 111 and a detection signal output from the gyro module 51 are output from a connector 114 to the outside of the camera module 100 via a flexible substrate 113.

<Flowchart>

Figure 7:
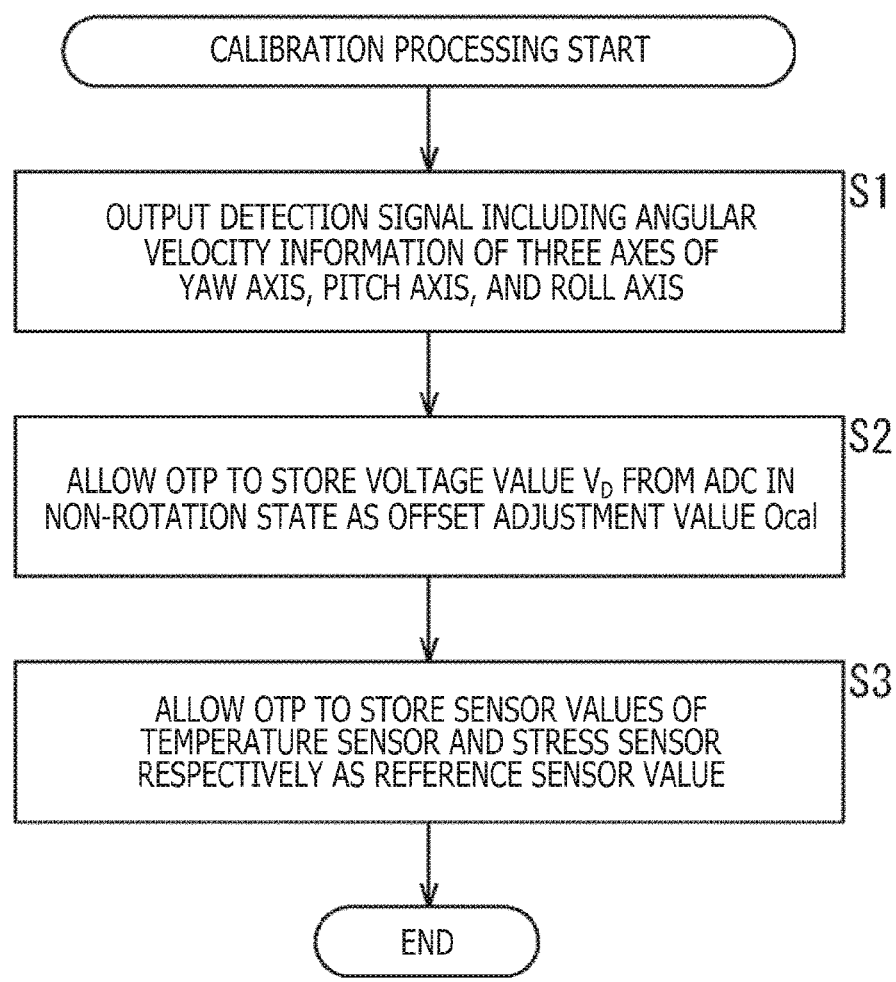
FIG. 7 is a flowchart describing the calibration processing.

Next, the calibration processing by the gyro module 51 will be described with reference to a flowchart illustrated in FIG. 7. For example, before shipping after the gyro module 51 is completed, the processing is performed in the non-rotation state in which the gyro module 51 itself is allowed to rest.

First, in step S1, the MEMS 11 outputs the detection signal including the angular velocity information of three axes of a yaw axis, a pitch axis, and a roll axis to the IC 12. A detection signal input into the IC 12 is amplified by the amplifier 22 and only the angular velocity information is taken out by the analog calculation section 23. Then, the angular velocity information is converted into a digital voltage signal $V_D$ by using the ADC 24 and supplied to the signal processing circuit 64.

In step S2, the signal processing circuit 64 of the IC 12 allows the OTP 63 to store the voltage value $V_D$ from the ADC 24 in the non-rotation state as the offset adjustment value Ocal. The OTP 63 stores the offset adjustment value Ocal.

In step S3, five temperature sensors 61A to 61E and five stress sensors 62A to 62E allow the OTP 63 to store the sensor values T1W to T5W and F1W to F5W detected by respective sensors as the reference sensor value. The OTP 63 stores the reference sensor values supplied from five temperature sensors 61A to 61E and five stress sensors 62A to 62E respectively.

The processes of steps S2 and S3 are performed at the same time, or alternatively the processes are performed at short continuous timing considered to be substantially simultaneous.

With that, the calibration processing ends.

Figure 8:
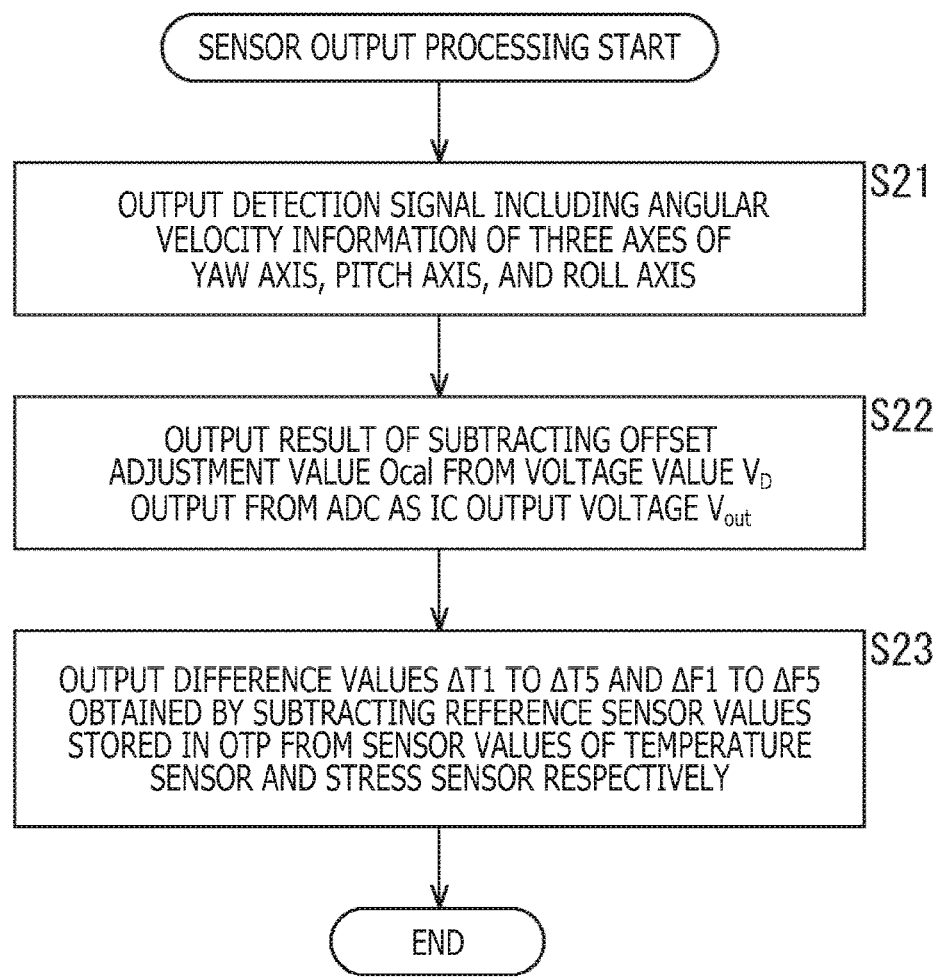
FIG. 8 is a flowchart describing the sensor output processing.

Next, the sensor output processing by the gyro module 51 will be described with reference to a flowchart illustrated in FIG. 8. For example, the processing is performed after starting up (turning on power) the gyro module 51 after the calibration processing illustrated in FIG. 7.

First, in step S21, the MEMS 11 outputs the detection signal including the angular velocity information of three axes of a yaw axis, a pitch axis, and a roll axis to the IC 12. The detection signal input to the IC 12 is amplified by the amplifier 22 and only the angular velocity information is taken out by the analog calculation section 23. Then, the angular velocity information is converted into the digital voltage signal $V_D$ by using the ADC 24 and is supplied to the signal processing circuit 64.

In step S22, the signal processing circuit 64 outputs the result ($V_D$–Ocal) in which the offset adjustment value Ocal stored in the OTP 63 is subtracted from the voltage value $V_D$ output from the ADC 24 to the outside of the gyro module 51 as the IC output voltage $V_{out}$.

In step S23, the signal processing circuit 64 outputs difference values ΔT1 to ΔT5 and ΔF1 to ΔF5 obtained by subtracting the reference sensor values T1W to T5W and F1W to F5W stored in the OTP 63 from the sensor values T1R to T5R and F1R to F5R detected by five temperature sensors 61A to 61E and five stress sensors 62A to 62E respectively to the outside of the gyro module 51.

The sensor output processing including the above-described steps S21 to S23 is repeatedly performed at predetermined timing such as a constant time interval.

Sensor Output Example

FIG. 9 illustrates an example of the sensor values T1 to T5 and F1 to F5 detected by five temperature sensors 61A to 61E and five stress sensors 62A to 62E respectively at the time of the gyro module 51 alone and after the gyro module 51 is mounted on the camera module 100.

When referring to FIG. 9, it is understood that the temperature and stress detected by respective sensors at the time of the gyro module 51 alone differ from those after mounting the gyro module 51 on the camera module 100. A change in an external environment before and after the mounting causes an occurrence of the offset to the IC output voltage $V_{out}$ regardless of the offset adjustment as illustrated in FIG. 2C. However, even if only viewing the IC output voltage $V_{out}$ as an angular velocity detection signal output from the gyro module 51, the presence or absence of the offset or the amount thereof is not understood.

To solve the above problem, the gyro module 51 outputs the difference values ΔT1 to ΔT5 and ΔF1 to ΔF5 between the reference sensor values at the time of the calibration processing in which the offset is adjusted and the sensor values that are compared with the reference sensor values and detected by the temperature sensors 61A to 61E and the stress sensors 62A to 62E, along with the IC output voltage $V_{out}$.

Through the process, an environment change after mounting the gyro module 51 on the camera module 100 can be known. Further, a designer of the camera module 100 that is the mounting module can carry on design of the camera module 100 so that a change in the sensor value is not caused before and after the mounting. When an environment in which the change in the sensor value is not caused before and after the mounting can be realized, it can be estimated that the offset does not occur in the IC output voltage $V_{out}$ output from the gyro module 51.

Therefore, according to the gyro module 51 of the present technology, a plurality of sensors that detect the external environment are evenly arranged within the IC 12 and the difference value between the sensor value after the mounting and that before the mounting is output. Thereby, variation and a variation distribution in the external environment of heat, stress, etc. in the module after the mounting can be monitored. Further, it is easy to give feedback to the design of the mounting module that mounts the gyro module 51. That is, it is easy to debug the environment change before and after mounting the gyro module 51 on the camera module 100. Further, it is easy to design an appropriate structure of the camera module 100 and it is possible to delete even an adjustment man-hour.

Modification Example/Application Example

In the embodiment described above, five temperature sensors 61 and five stress sensors 62 are arranged within the IC 12. However, the number of the temperature sensors 61 and the number of the stress sensors 62 to be arranged within the IC 12 are not limited to five. It is sufficient if the number of the temperature sensors 61 and the number of the stress sensors 62 are two or more. In addition, the number of the temperature sensors 61 and the number of the stress sensors 62 may be different from each other.

For that matter, five temperature sensors 61 and five stress sensors 62 are evenly arranged in the planar direction. However, a plurality of the sensors may not be evenly arranged. With regard to a sensor (external environment detection sensor) that detects an external environment to be arranged within the IC 12, either of the temperature sensor 61 and the stress sensor 62 may be used. Alternatively, sensors other than the temperature sensor 61 and the stress sensor 62 may be used. As other external environment detection sensors, for example, an electromagnetic wave sensor that detects an electromagnetic wave (light, infrared light, or the like), a magnetic sensor, and the like can be adopted.

That is, a type, an arrangement location, and the number (in this regard, however, two or more) of the external environment detection sensors that are arranged within the IC 12 are not limited thereto.

Further, in the camera module 100 that is the mounting module that mounts the gyro module 51, one or more external environment control devices that change the external environment such as a heater device or a cooling device may be arranged around the gyro module 51 on the substrate 112. Further, on the basis of the difference values ΔT1 to ΔT5 and ΔF1 to ΔF5 output from the gyro module 51, the external environment control device may be dynamically controlled (adjusted) so that the external environment is matched with a situation before mounting the module and is impartially even.

In the embodiment described above, an example in which a change in the offset of the IC output voltage $V_{out}$ output by the gyro module 51 is adjusted as the calibration processing is described. Further, since even a gain is changed on the basis of a difference of the external environment, the present technology can be applied even to the gain similarly to the offset.

Specifically, at the time of gain-error calibration processing for adjusting a gain error, the IC 12 allows the OTP 63 to store a gain adjustment value $G_{cal}$ and the reference sensor values T1W to T5W and F1W to F5W at that time. Further, there is designed a mounting module structure such that the difference values ΔT1 to ΔT5 and ΔF1 to ΔF5 are equal to zero between the sensor values after mounting the gyro module 51 on the camera module 100 and the reference sensor values written in the OTP 63. The process permits the camera module 100 in which a change in the gain is not present before and after the mounting to be designed.

In the embodiment described above, the gyro module 51 in which the MEM 11 that is a sensor that detects an angular velocity and the IC 12 that is a signal processing chip that processes a detection signal from the MEMS 11 are laminated above and below is described.

Further, the present technology can be applied to an arbitrary chip module (IC chip module) in which various kinds of sensors that are formed into a chip and a signal processing IC that processes the detection signal from the sensor are laminated above and below.

Examples of the chip-shaped sensor laminated with the signal processing IC include a large board of image sensor and the like. The image sensor may cause degradation of image quality due to a change in the external environment such as nonuniformity of ambient temperature. According to the present technology, it is possible to design a chip module that prevents the degradation of image quality.

Mounting Example of Electronic Equipment

The above-described camera module 100 after the mounting can be mounted on various kinds of electronic equipment, for example, an image pickup apparatus such as a digital still camera or a digital video camera, a mobile phone including an image pickup function, an audio player including an image pickup function, or the like.

Figure 10:
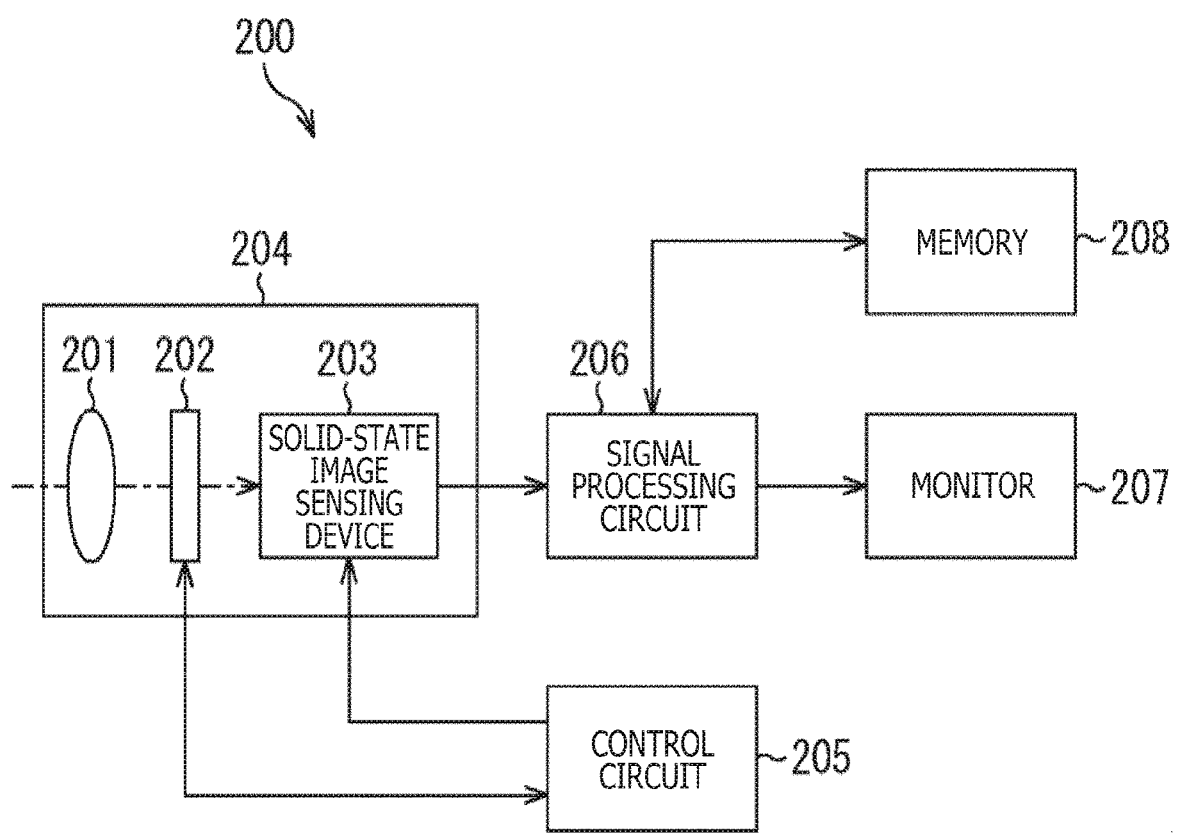
FIG. 10 is a block diagram illustrating a configuration example of an image pickup apparatus as electronic equipment to which the present technology is applied.

FIG. 10 is a block diagram illustrating a configuration example of the image pickup apparatus as electronic equipment to which the present technology is applied.

An image pickup apparatus 200 illustrated in FIG. 10 includes a camera module 204 in which an optical system 201, a shutter apparatus 202, a solid-state image sensing device 203, and the like are packaged, a control circuit 205, a signal processing circuit 206, a monitor 207, and a memory 208, and can capture a still image and a moving image.

The optical system 201 has one piece or a plurality pieces of lenses. Further, the optical system 201 conducts light (incident light) from a photographic subject to the solid-state image sensing device 203 and forms an image of light on a light-receiving surface of the solid-state image sensing device 203.

The shutter apparatus 202 is arranged between the optical system 201 and the solid-state image sensing device 203. Further, the shutter apparatus 202 controls a light irradiation period and a light-shielding period to the solid-state image sensing device 203 in accordance with control of the control circuit 205.

The solid-state image sensing device 203 accumulates signal charges for a certain period in accordance with light formed on the light-receiving surface via the optical system 201 and the shutter apparatus 202. The signal charges accumulated on the solid-state image sensing device 203 are transferred to the signal processing circuit 206 in accordance with a driving signal (timing signal) supplied from the control circuit 205. The camera module 204 is configured by the above-described camera module 100. In the camera module 204, the signal processing circuit 206 may be included.

The control circuit 205 outputs a driving signal for controlling transfer operations of the solid-state image sensing device 203 and shutter operations of the shutter apparatus 202 and drives the solid-state image sensing device 203 and the shutter apparatus 202.

The signal processing circuit 206 performs various kinds of signal processing on a pixel signal output from the solid-state image sensing device 203. An image (image data) obtained by performing the signal processing by the signal processing circuit 206 is supplied to the monitor 207 to be displayed thereon or supplied to the memory 208 to be stored (recorded) therein.

Embodiments of the present technology are not limited to the embodiment described above and can be variously modified without departing from the gist of the present technology.

Further, the respective steps described in the flowcharts described above can be shared and executed by a plurality of blocks in addition to executing them by a single block.

Furthermore, in a case where a plurality of processing are included in a single step, the plurality of processing included in the single step can be shared and executed by a plurality of blocks in addition to executing them by a single block.

In this specification, not only the steps described in the flowcharts may be performed in a time-series manner in accordance with a described sequence, but also the steps may not be always processed in a time-series manner. That is, the steps may be executed in parallel, or may be executed at necessary timing when a call is made, and the like.

Note that the effects described in the present specification are mere examples and should not be limited, and effects other than those described in the present specification may also be obtained.

Note that the present technology can also take the following configurations.

(1)
A chip module including:
a sensor that is formed into a chip; and a signal processing IC that processes a detection signal from the sensor, the sensor and the signal processing IC being arranged above and below, in which the signal processing IC has an external environment sensor that detects an external environment within an IC in plurality and outputs a difference value obtained by subtracting a reference sensor value that is a sensor value of the external environment sensor at a time of calibration from a sensor value detected by a plurality of the external environment sensors respectively.

(2)

The chip module according to (1) above, in which the plurality of external environment sensors are evenly arranged in a planar direction.

(3)

The chip module according to (1) or (2) above, in which the signal processing IC has plural kinds of the external environment sensors respectively within the IC in plurality.

(4)

The chip module according to any one of (1) to (3) above, in which the external environment sensor includes a stress sensor.

(5)

The chip module according to any one of (1) to (4) above, in which the external environment sensor includes a temperature sensor.

(6)

The chip module according to any one of (1) to (5) above, in which the external environment sensor includes transistors within the IC.

(7)

The chip module according to any one of (1) to (6) above, in which the calibration includes calibration for adjusting an offset of a module output.

(8)

The chip module according to any one of (1) to (6) above, in which the calibration includes calibration for adjusting a gain of the module output.

(9)

The chip module according to any one of (1) to (8) above, in which the signal processing IC stores the reference sensor value at the time of calibration in an OTP and calculates the difference value obtained by subtracting the reference sensor value stored in the OTP from the sensor value detected by the plurality of external environment sensors respectively.

(10)

A signal processing method of a chip module, including:
having, in a chip module including a sensor that is formed into a chip and a signal processing IC that processes a detection signal from the sensor, the sensor and the signal processing IC being arranged above and below, an external environment sensor that detects an external environment within an IC in plurality by the signal processing IC; and outputting a difference value obtained by subtracting a reference sensor value that is a sensor value of the external environment sensor at a time of calibration from a sensor value detected by a plurality of the external environment sensors respectively.

(11)

Electronic equipment including:
a chip module including a sensor that is formed into a chip, and a signal processing IC that processes a detection signal from the sensor, the sensor and the signal processing IC being arranged above and below, in which the signal processing IC has an external environment sensor that detects an external environment within an IC in plurality and outputs a difference value obtained by subtracting a reference sensor value that is a sensor value of the external environment sensor at a time of calibration from a sensor value detected by a plurality of the external environment sensors respectively.

REFERENCE SIGNS LIST

11 MEMS, 12 IC, 51 Gyro module, 61 (61A to 61E) Temperature sensor, 62 (62A to 62E) Stress sensor, 63 OTP, 64 Signal processing circuit, 100 Camera module, 200 Image pickup apparatus, 204 Camera module

The invention claimed is:

1. A chip module, comprising:
 a sensor; and
 a signal processing IC, wherein
  the sensor is on the signal processing IC, and
  the signal processing IC is configured to:
   process a detection signal from the sensor, wherein the signal processing IC has a plurality of external environment sensors, and
   each of the plurality of external environment sensors is configured to detect a sensor value of an external environment;
   obtain, for each of the plurality of external environment sensors, a difference value based on subtraction of a reference sensor value associated with a respective sensor of the plurality of external environment sensors from the detected sensor value of the respective sensor of the plurality of the external environment sensors, wherein the reference sensor value for each of the plurality of external environment sensors corresponds to the sensor value of the external environment at a time of calibration; and
   output the difference value for each of the plurality of external environment sensors.

2. The chip module according to claim 1, wherein the plurality of external environment sensors is in an even arrangement in a planar direction.

3. The chip module according to claim 1, wherein the plurality of external environment sensors corresponds to a plural kind of sensors.

4. The chip module according to claim 1, wherein the plurality of external environment sensors includes a stress sensor.

5. The chip module according to claim 1, wherein the plurality of external environment sensors includes a temperature sensor.

6. The chip module according to claim 1, wherein the plurality of external environment sensors includes a plurality of transistors.

7. The chip module according to claim 1, wherein the calibration includes adjustment of an offset of a module output.

8. The chip module according to claim 1, wherein the calibration includes adjustment of a gain of a module output.

9. The chip module according to claim 1, wherein
 the signal processing IC further includes a one-time programmable read only memory (OTP),
 the signal processing IC is further configured to store stores the reference sensor value of each of the plurality of external environment sensors at the time of the calibration in the OTP, and obtain the difference value based on the subtraction of the reference sensor value stored in the OTP from the sensor value of the respective sensor of the plurality of external environment sensors.

10. A signal processing method, comprising:

in a chip module that includes a sensor and a signal processing IC:

processing, by the signal processing IC, a detection signal from the sensor, wherein
  the sensor is on the signal processing IC, and
  the signal processing IC has a plurality of external environment sensors;

detecting, by each of the plurality of external environment sensors, a sensor value of an external environment; and obtaining, by the signal processing IC for each of the plurality of external environment sensors, a difference value based on subtraction of a reference sensor value associated with a respective sensor of the plurality of external environment sensors from the detected sensor value of the respective sensor of the a plurality of the external environment sensors, wherein the reference sensor value for each of the plurality of external environment sensors corresponds to the sensor value of the external environment at a time of calibration; and outputting, by the signal processing IC, the difference value for each of the plurality of external environment sensors.

11. Electronic equipment, comprising:
a chip module that includes:
  a sensor; and
  a signal processing IC, wherein
the sensor is on the signal processing IC, and
the signal processing IC is configured to:
  process a detection signal from the sensor, wherein
    the signal processing IC has a plurality of external environment sensors, and
    each of the plurality of external environment sensors is configured to detect a sensor value of that dctccts an external environment;
  obtain, for each of the plurality of external environment sensors, a difference value based on subtraction of a reference sensor value associated with a respective sensor of the plurality of external environment sensors from the detected sensor value of the respective sensor of the a plurality of the external environment sensors, wherein the reference sensor value for each of the plurality of external environment sensors corresponds to the sensor value of the external environment at a time of calibration; and
  output the difference value for each of the plurality of external environment sensors.

* * * * *